United States Patent [19]
Higgins, Jr.

[11] Patent Number: 5,329,256
[45] Date of Patent: Jul. 12, 1994

[54] TUNABLE OSCILLATOR HAVING A NON-REFLECTIVE SAW RESONATOR

[75] Inventor: Robert J. Higgins, Jr., Plantation, Fla.

[73] Assignee: Motorola, Inc., Schaumburg, Ill.

[21] Appl. No.: 85,524

[22] Filed: Jun. 30, 1993

[51] Int. Cl.$^5$ .............................................. H03B 5/32
[52] U.S. Cl. .............................. 331/107 A; 331/36 C; 331/177 V; 455/76
[58] Field of Search ............ 331/107 A, 36 C, 177 V; 455/76

[56] References Cited

U.S. PATENT DOCUMENTS 4,581,592  4/1986  Bennett ........................... 331/107 A
5,043,681  8/1991  Tanemura et al. ............... 331/107 A Primary Examiner—Siegfried H. Grimm
Attorney, Agent, or Firm—Robert S. Babayi

[57] ABSTRACT

A tunable oscillator circuit (200) includes surface acoustic wave transducer (303) disposed on a piezoelectric substrate (301) having a high SAW coupling coefficient. The SAW transducer is (303) non-reflective and self-resonant comprising a pair of electrodes with interdigitated fingers. A tuning mechanism, such as a varactor, is coupled across the transducer allowing for output frequency tuning of the oscillator circuit.

23 Claims, 3 Drawing Sheets

TUNABLE OSCILLATOR HAVING A NON-REFLECTIVE SAW RESONATOR

CROSS REFERENCE TO RELATED APPLICATIONS

This application is related to U.S. patent application Ser. No. 08/085,526 entitled "A Three-Terminal Surface Acoustic Wave (SAW) Device," by Robert J. Higgins, Jr., filed on Jun. 30, 1993 and assigned to Motorola, Inc.

TECHNICAL FIELD

This invention relates generally to voltage controlled oscillators (VCO) structures and more particularly to a VCO which uses a Surface Acoustic Wave (SAW) structure.

BACKGROUND

Electric oscillators are extensively used in many applications where there is a need to generate one or more predetermined frequency output. For example, in frequency modulation (FM) radio frequency (RF) communication, RF receivers and RF transmitters use oscillators for generating carrier frequencies.

Generally, oscillators operate at a particular resonant frequency. An oscillator's resonant frequency is determined by reactive elements of a tank circuit which comprises capacitive and inductive components. In conventional voltage controlled oscillators (VCOs), a variable reactive element in the tank circuit controls the resonant frequency of the oscillator. Often, the variable element is a two-terminal, non-linear capacitor, such as a semiconductor varactor, which is responsive to a control signal for controlling the value of its capacitance. Such tank circuit resonators provide a very wide tuning range (i.e. in the range of 3 MHz to 30 MHz) which makes them particularly suitable in frequency synthesized land-mobile communication applications.

Conventionally, transmission lines and coaxial distributed structures have been used as a substitute for the inductive component of the tank circuit. However, the fundamental companion element to the variable capacitor has relied upon magnetic field storage to provide the inductive reactance necessary to resonate an oscillator with the variable capacitor. As the inductor's component size is being reduced in response to the miniaturization drive in the electronics industry, the resonator's quality factor, Q, decreases. Decreased quality factor, has a number of undesired consequences, namely, degradation of VCO's sideband noise performance and desence performance. Additionally, because an inductor's magnetic field is very difficult to shield, VCO generated signals, spurious or otherwise, are undesirably coupled to the surrounding circuit.

Another problem frequently encountered in conventional VCOs, is a phenomenon known as "microphonics" which adversely affects an FM receiver's performance. Microphonics is a phenomenon whereby mechanical vibrations around the VCO structure are picked up by the electromagnetic inductor, thereby changing its effective inductance. As such, the resonant frequency of the VCO is changed. Since, in FM systems, the frequency changes are demodulated, the resonant frequency changes are manifested as undesired hum and noise which adversely affect the receiver's audio output.

There have been attempts in the past to use SAW devices in VCOs. SAW devices use acoustic waves which travel at the speed of sound. The SAW devices are preferred over widely used transmission line, and discrete components because acoustic waves have a substantially shorter wave length at operating frequency than electromagnetic waves which travel at the speed of light. These devices are less susceptible to stray magnetic and other problems associated with resonators which utilize magnetic inductors. Furthermore, for a given operating frequency, a SAW resonator provides a smaller structure than a transmission line structure, therefore, making them suitable for miniaturized radio frequency applications. Additionally, SAW structures are potentially integratable with other active circuits, such as amplifiers and varactors, which are produced using conventional integrated circuit technologies.

For the above reasons, the popularity of SAW structures in radio frequency applications has been steadily increasing, especially in resonator filter applications. FIG. 1 depicts the diagram of a conventional SAW resonator structure 100 which shows a SAW transducer 110 and a pair of reflectors 120 disposed on a piezoelectric substrate 105. As is well known, the reflectors increase quality factor of the SAW resonator by preventing dissipation of surface acoustic waves emanating from the SAW transducer 110 near the resonant frequency. The SAW transducer 110 comprises a first electrode 112 having a first set of open-ended fingers 114 and a second electrode 116 having a second set of open-ended fingers 118. The first electrode 112 and the second electrode 116 comprise conductive layers patterned on the piezoelectric substrate such that a first set of fingers 114 and a second set of fingers 118 are interdigitated in relation to each other.

Conventionally the substrate 105 is made of a material with low temperature coefficient, such as quartz. As such, the SAW resonator is used in applications where a stable, high frequency (within 100 MHz–1000 MHz range) source is desired. Historically, SAW resonators have not been used as oscillators in land-mobile communication because it is extremely difficult to get the resonant frequency to change, over a wide tuning range, with a variable capacitor. Typically, the tuning range of for a 900 MHz SAW resonator has been in the range of only a few kilohertz, whereas, in land-mobile applications, a typical VCO in that frequency range must tune in megahertz range.

Therefore, there exists a need for an oscillator circuit which overcomes the problems associated with magnetically induced oscillators while providing a substantially wide tuning range.

SUMMARY OF THE INVENTION

Briefly, according to the invention, an oscillator circuit for providing an output frequency comprises a SAW resonator and a capacitive tuning means coupled across the SAW resonator for tuning the output frequency. The SAW resonator is non-reflective and self-resonant comprising a piezoelectric substrate upon which a SAW transducer is disposed. The SAW transducer includes a pair of electrodes with a large number of interdigitated open-ended fingers, wherein the surface acoustic waves emanating from transducer sides are not reflected back. In order to provide wide tuning range, the piezoelectric material is made of material having substantially high surface acoustic wave coupling coefficient.

DETAILED DESCRIPTION OF THE PREFERRED EMBODIMENT

Figure 1:
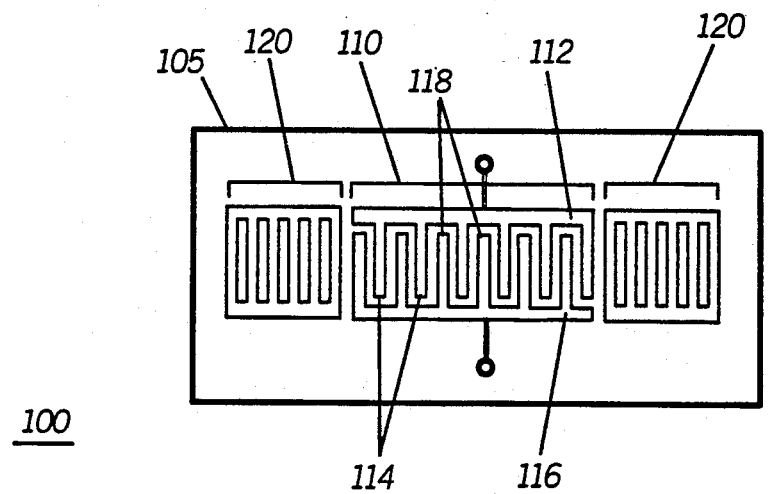
FIG. 1 depicts a diagram of a prior art SAW filter structure.

While the specification concludes with claims defining the features of the invention that are regarded as novel, it is believed that the invention will be better understood from a consideration of the following description in conjunction with the drawing figures, in which like reference numerals are carried forward.

Figure 2:
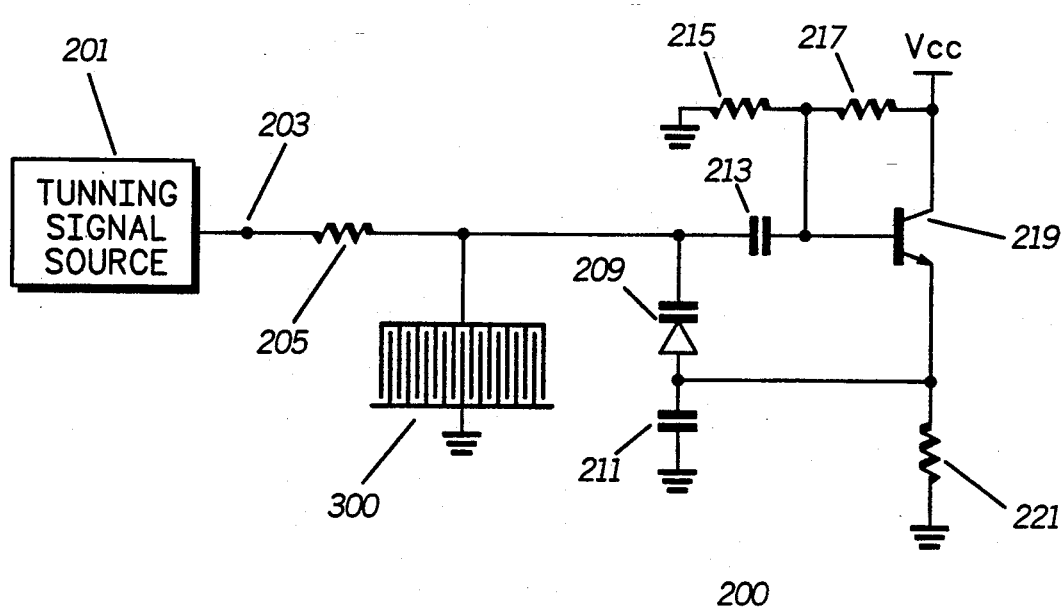
FIG. 2 is a schematic diagram of a voltage controlled oscillator circuit according to the present invention.

Referring to FIG. 2, a schematic diagram of a voltage controlled oscillator (VCO) 200, according to the present invention, is shown. The VCO 200 provides a frequency output which is tunable within a predetermined tuning range. The VCO includes a SAW resonator 300 coupled across a varactor 209 which is responsive to a tuning signal generated by a tuning signal source 201. The tuning signal is received at a tuning port 203 and applied to the varactor 209 through a resistor 205. The varactor 209 is coupled to ground through a capacitor 211. The present invention contemplates using inductive properties of the SAW resonator 300 to resonate the oscillator portion of the VCO 200, thus, replacing the electromagnetic inductor used in conventional VCO designs. The combined effect of the parallel arrangement of the inductive property of the SAW resonator 300 and the capacitive property of the varactor 209 which is coupled across the resonator 300, causes the VCO to be resonant at a specific frequency. As is well known, capacitive variations across the varactor 209 in response to the tuning signal tunes the frequency output within the tuning range. As such the varactor 209 constitutes a tuning means coupled across the SAW resonator 300 for tuning the output frequency of the tunable oscillator of the present invention. It may be appreciated that besides a varactor, other tuning means, such as a mechanically variable capacitor or a combination of a variable capacitor and an inductor, may be used across the resonator 30 to tune the output frequency. Furthermore, as described later in detail, the SAW resonator 300 posses certain characteristics which provide a wider tuning range for the VCO than the substantially narrow tuning range available from the conventional SAW resonators. The frequency of the oscillating portion of the VCO, i.e. the SAW resonator 300 and the varactor 209, is coupled to an amplifier stage through a capacitor 213. The amplifier stage comprises a transistor 219 which provides the frequency output of the VCO. Resistors 217, 215, and 221 provide the biasing for the transistor 219, as is well known in the art. The output of the VCO is fed back to the oscillating portion of the VCO by coupling transistor 219's emitter to capacitor 211.

Figure 3:
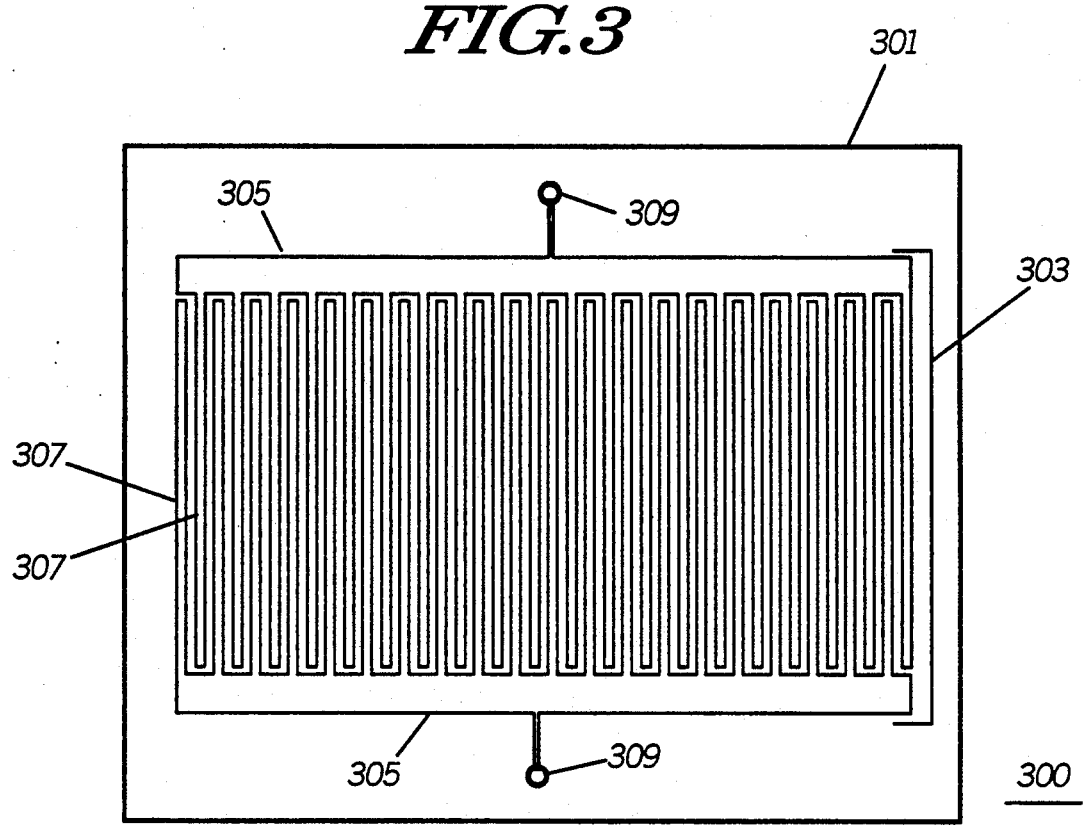
FIG. 3 is a top plan view of a SAW resonator used in the oscillator of FIG. 2.

Referring to FIG. 3, a top plan view of the SAW resonator 300 used in the oscillator circuit of the present invention is shown. The SAW structure is comprised of a piezoelectric substrate 301 upon which conductive patterns constituting a SAW transducer 303 is disposed. The substrate 301 is made of suitable piezoelectric material which, as described later, possesses the appropriate properties for producing the desired frequency tuning characteristics. The transducer 303 may be disposed on the piezoelectric substrate 301, utilizing any number of suitable techniques, such as thin film evaporation, or spattering with photo-lithographic definition. The SAW transducer 303 is patterned to include a pair of electrodes 305 having interdigitated open ended fingers 307 which are equally spaced according to the resonant frequency of the SAW resonator 300. Each of the electrodes terminate at terminals 309 which provide for interfacing the SAW resonator 300 with the other elements of the oscillator circuit 200 of the present invention. As shown in FIG. 2 the capacitive element of the oscillator circuit, that is, the varactor 209 is coupled across the terminals 309. The center-to-center spacing of the interdigitated fingers determines the resonant frequency of the resonator 300 and is equal to ½ the wave length of the surface acoustic wave at resonant frequency. Contrary to most conventional SAW resonators, the SAW resonator 300 is non-reflective and self-resonant. That is, the SAW resonator 300 does not include reflecting means for reflecting the surface acoustic waves emanating from the sides of the SAW transducer 303.

Figure 4:
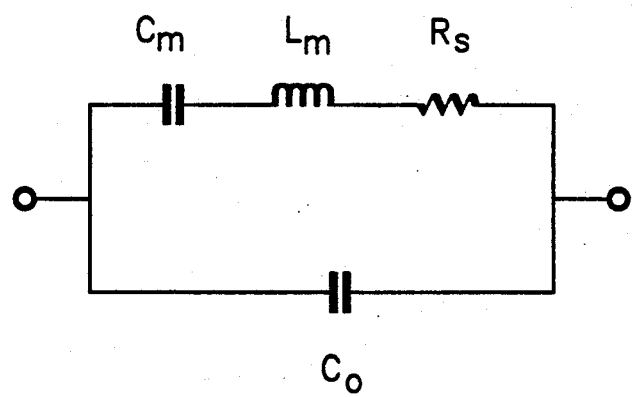
FIG. 4 is an equivalent circuit diagram of the SAW resonator of FIG. 3.

In order to provide wide tuning range essential to the VCO circuits, the SAW resonator 300 posses certain characteristics which are described below. Referring to FIG. 4, an equivalent circuit 300' for the SAW resonator 300 of FIG. 3, which models effects of the acoustic circuit from an electrical perspective, is shown. As illustrated, the equivalent circuit 300' is represented by a parallel network comprising capacitance $C_0$, and serially coupled motional capacitance $C_m$, motional inductance $L_m$ and resistance Rs. It has been determined that the tuning range is directly proportional to the ratio of $C_m/C_0$. Therefore, widest tuning range is provided when the ratio of $C_m/C_0$ is as high as possible. For a self resonant transducer, the ratio of $C_m/C_0$ can be expressed by the following equation:

$$C_m/C_0 = 8 \times K^2/\pi^2 \qquad (1).$$

Where $K^2$ is coupling coefficient of substrate 301. The coupling coefficient represents the electro-mechanical property of piezoelectric substrate to convert electrical power to the surface-acoustic-wave's power and vice versa. As seen from Equation 1, there exists a direct relationship between the coupling factor $K^2$ and the $C_m/C_0$ ratio. Thus, according to the invention, in order to achieve a substantially wide tuning range, a substrate having substantially high coupling coefficient, $K^2$, is used. It has been determined that piezoelectric substrates with high coupling coefficients, particularly those exceeding 2 percent, are suitable for use in the VCO 200 of the present invention. Piezoelectric substrates such as lithium niobate, lithium tantalate, or lead zirconate titanate, when cut at proper angles, offer high coupling coefficient. For example, the lithium niobate when cut at a 41 degree angle exhibits coupling coefficient of approximately 17%. Other exemplary high coupling coefficient piezoelectric substrates suitable for use in the oscillator circuit of the present invention include 36 degree-cut lithium tantalate and 64 degree-cut lithium niobate.

Another factor affecting the $C_m/C_0$ ratio relates to the reflectors. As described above, the SAW resonator 300 is a non-reflective, self-resonant resonator with no reflectors disposed on its opposing outer sides. As such the acoustic waves emanating from sides of the transducer 303 are not reflected back by reflecting means conventionally used in SAW resonator structure. It has been determined that the self-resonant transducers offer a $C_m/C_0$ ratio of approximately 4 times that of transducers with reflective elements.

Furthermore, it is desirable for the oscillator to exhibit a high unloaded quality factor, $Q_u$, within the tuning range of the oscillator. The unloaded quality factor, $Q_u$, of the SAW resonator 300 can be expressed by the following equation:

$$Q_u = N\pi/4 \qquad (2).$$

Where N is the number of interdigitated fingers in the SAW transducer 303. However, elimination of reflective elements from the self-resonant resonator 300 substantially reduces the unloaded quality factor $Q_u$ thereof. According to the present invention the reduction in the quality factor is compensated by increasing the number of fingers in the transducer 300. In current state of art (that is, VCOs which utilize inductive and capacitive elements), $Q_u$ is typically within 50-250 range with greater value being more desirable. Based on Equation 2, it has been determined that a transducer with approximately 70 fingers offers $Q_u$ of 50 and one with 320 fingers offers $Q_u$ of 250. Therefore, in the present invention the requirement for high $Q_u$ and wide tuning range are balanced by utilizing a high coupling coefficient piezoelectric substrate and a non-reflective, self-resonant resonator having a transducer with a number of fingers for compensating some of $Q_u$ degradation caused by elimination of the reflectors.

Figure 5:
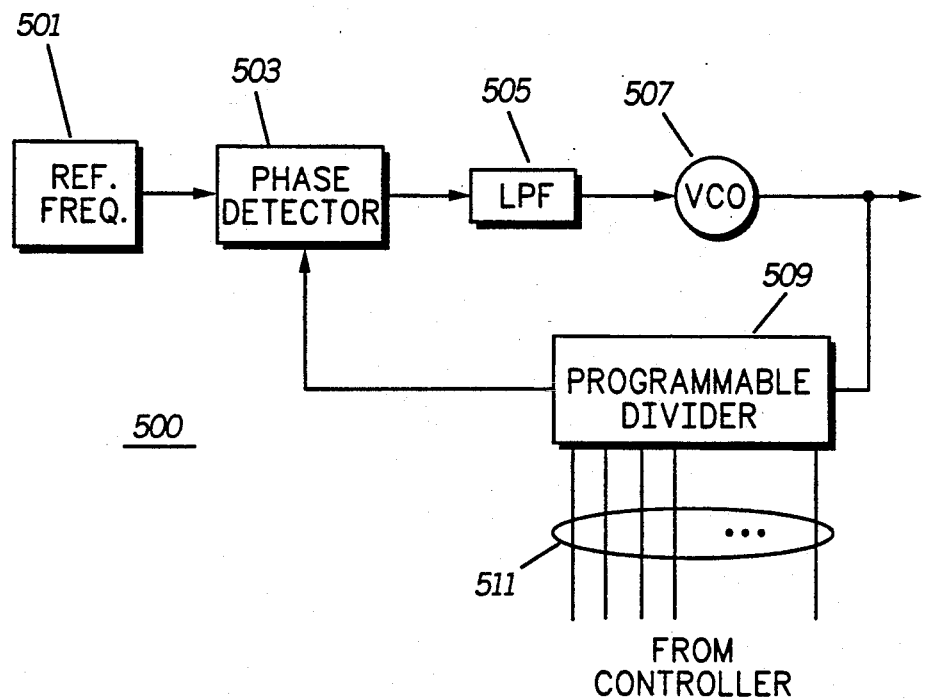
FIG. 5 is a block diagram of a phase-locked loop synthesizer which uses the oscillator of FIG. 2.

Substrates such as lithium niobate and lithium tantalate despite offering high coupling coefficient, exhibit rather poor temperature coefficient. The poor temperature coefficients exhibited by the high coupling coefficient substrates are compensated for by utilizing the VCO 200 of the present invention in a phase-locked loop (PLL) synthesizer. This is because output feedback of the PLL would automatically compensate for instabilities caused by poor ambient temperature coefficient of the high coupling substrate 301. Referring to FIG. 5, a block diagram of such a PLL circuit is shown. As shown, the phase-lock loop circuit 500 includes a VCO 507 having its output fed to a well known programmable divider 509. The VCO 507 comprises a VCO constructed according to the principles of the present invention including the resonant SAW resonator 300. The programmable divider 509 receives divider signals 511 from a controller or other suitable source for setting the desired frequency output of the PLL. The output of the programmable divider is applied to a well known phase detector 503 which compares the phase of the divider's output with the phase of a reference signal as provided by a reference frequency source 501. An error signal produced by the phase detector and corresponding to the phase difference between the programmable divider and the reference frequency is applied to a low pass filter 505. The output of the low pass filter is applied to the VCO 507 as a tuning signal for providing a desired output frequency of the VCO. Output of the VCO is fed back to the divider 509 and, as such, any variations in the frequency output is compensated by minimizing the error signal at the output of the phase detector 503. Because of the output feedback loop in the phase-lock loop circuit, any temperature variation would be compensated for by the loop itself and, therefore, the need for a highly-stable temperature coefficient substrate in the VCO is eliminated. As a result, a high coupling coefficient substrate (with poor temperature coefficient) could be used in the SAW transducer section of the VCO 507, thereby allowing for a wide tuning range as contemplated by the present invention.

Figure 6:
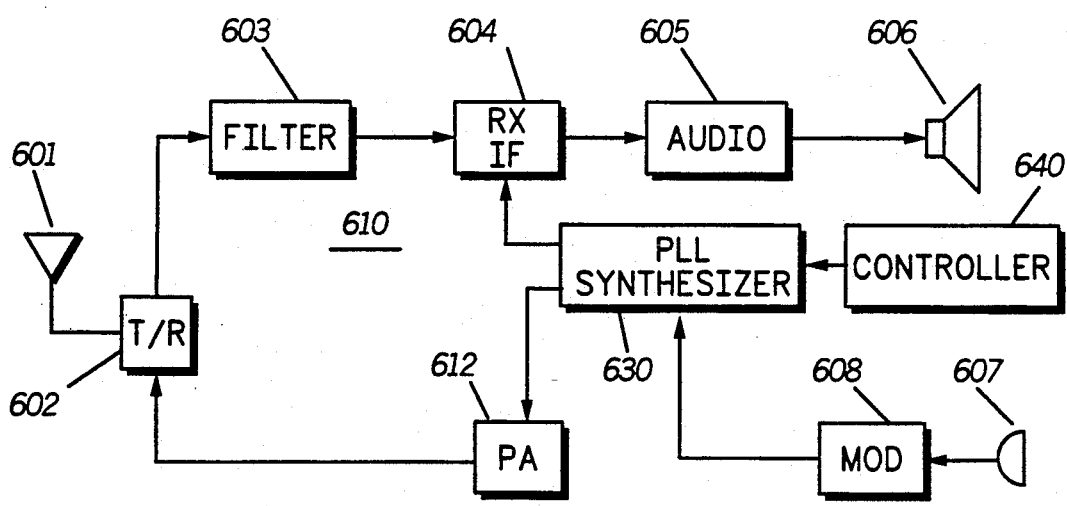
FIG. 6 is a block diagram of a radio which uses the oscillator of FIG. 2.

Referring to FIG. 6, the voltage controlled oscillator and the PLL synthesizer of the present invention are utilized in a radio 600. The radio 600 comprises a two-way radio, which may operate in either receive or transmit modes. The radio 600 includes a receiver section 610, and a transmitter section 620 which comprise means for communicating communication messages, on a receiver and transmitter carrier frequencies. The radio 600 also includes a PLL synthesizer section 630 of the present invention which under control of a controller 640 tunes the transmitter and the receiver sections 610 and 620 to operate within a desired frequency band. As is well known in the art, the controller 640 provides the control signals for setting the phase locked loop synthesizer at a particular receive or transmit frequency. The PLL synthesizer 630 incorporates the VCO of the present invention for providing frequency outputs corresponding to receiver and transmitter carrier frequencies.

In the receive mode, the portable radio 600 is tuned to receive a communication signal via an antenna 601. A transmit/receive (T/R) switch 602 couples the received communication signal to a filter 603 which provides the desired selectivity for the received communication signal. The output of the filter 603 is applied to a well-known receiver IF section 604 which recovers the base band signal. The output of the receiver IF section is applied to a well-known audio section 605 which, among other things, amplifies audio messages and presents them to a speaker 606. It may be appreciated by one of ordinary skill in the art that the control voltage for setting the output frequency of the synthesizer 630 and consequently the carrier frequency of the receiver is provided by the controller 640, which also controls the entire operation of the radio 600.

In the transmit mode, audio messages are inputted via a microphone 607, the output of which is applied to a well-known modulator 608 to provide a frequency modulating signal for the PLL synthesizer section 630. A transmitter power amplifier 612 amplifies the output of the modulated PLL synthesizer and applies it to the antenna 601 through the T/R switch 602 for transmission of the communication signal. Similar to receiver carrier frequency, the transmitter carrier frequency is provided by the PLL synthesizer 630 of the present invention under the control of the controller 640.

As described above, the VCO of the present invention utilizes properties of the SAW resonator 300 to provide resonance in the presence of the capacitive element of the VCO, i.e. the varactor 209. One of the main advantage offered by the VCO 200 is that the SAW resonator 300 eliminates the electromagnetic inductive element used in conventional VCO circuits. As such, unlike conventional VCOs, the VCO 200 is immune to external factors, such as microphonics, which effect the electromagnetic field surrounding the oscillator. Furthermore, the VCO of present invention may be fabricated in much smaller sizes than those possible with electromagnetic inductive elements without sacrificing $Q_u$ and consequently sideband noise performance.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A tunable oscillator circuit for providing an output frequency, comprising:
   a non-reflective, self-resonant SAW resonator including:
      a piezoelectric substrate; and
      a SAW transducer portion disposed on said piezoelectric substrate having at least one pair of electrodes with interdigitated open-ended fingers, wherein surface acoustic waves emanating from said SAW transducer are not reflected; and
   capacitive tuning means coupled across said resonator for tuning said output frequency.

2. The tunable oscillator circuit of claim 1, wherein said piezoelectric substrate is made of a material having a SAW coupling coefficient substantially exceeding 2%.

3. The tunable oscillator circuit of claim 2, wherein said piezoelectric substrate comprises lithium niobate.

4. The tunable oscillator circuit of claim 2, wherein said piezoelectric substrate comprises lithium tantalate.

5. The tunable oscillator circuit of claim 2, wherein said piezoelectric substrate comprises lead zirconate titanate.

6. The tunable oscillator of claim 1, wherein said capacitive tuning means comprises a varactor.

7. A voltage controlled oscillator circuit for providing an output frequency, comprising:
   a tuning port for receiving a tuning signal;
   tuning means for tuning said output frequency in response to said tuning signal; and
   a non-reflective, self-resonant SAW resonator coupled to said tuning means including:
      a piezoelectric substrate; and
      a SAW transducer portion disposed on said piezoelectric substrate having at least one pair of electrodes with interdigitated open-ended fingers, wherein surface acoustic waves emanating from said SAW transducer are not reflected.

8. The voltage controlled oscillator circuit of claim 7, wherein said piezoelectric substrate is made of a material having a SAW coupling coefficient substantially exceeding 2%.

9. The voltage controlled oscillator circuit of claim 8, wherein said piezoelectric substrate comprises lithium niobate.

10. The voltage controlled oscillator circuit of claim 8, wherein said piezoelectric substrate comprises lithium tantalate.

11. The voltage controlled oscillator circuit of claim 8, wherein said piezoelectric substrate comprises lead zirconate titanate.

12. The voltage controlled oscillator circuit of claim 7, wherein said capacitive tuning means comprises a varactor.

13. A frequency synthesizer; comprising:
   a phase locked loop including a voltage controlled oscillator circuit for providing an output frequency, comprising:
      a tuning port for receiving a control signal from said phase locked loop;
      tuning means for tuning said output frequency in response to said control signal; and
      a non-reflective, self resonant SAW resonator coupled to said tuning means including:
         a piezoelectric substrate having a coupling coefficient exceeding 2%; and
         a SAW transducer portion disposed on said piezoelectric substrate having at least one pair of electrodes with interdigitated open-ended fingers, wherein surface acoustic waves emanating from said SAW transducer are not reflected.

14. The frequency synthesizer of claim 13, wherein said piezoelectric substrate comprises lithium niobate.

15. The frequency synthesizer of claim 13, wherein said piezoelectric substrate comprises lithium tantalate.

16. The frequency synthesizer of claim 13, wherein said piezoelectric substrate comprises lead zirconate titanate.

17. The frequency synthesizer of claim 13, wherein said capacitive tuning means comprises a varactor.

18. A radio, comprising:
   communication means for communicating communication messages; and
   a tunable oscillator circuit for providing an output frequency usable by said communication means, comprising:
      a non-reflective, self-resonant SAW resonator including:
         a piezoelectric substrate; and
         a SAW transducer portion disposed on said piezoelectric substrate having at least one pair of electrodes with interdigitated open-ended fingers, wherein surface acoustic waves emanating from said SAW transducer are not reflected; and
      capacitive tuning means coupled across said electrodes for tuning said output frequency.

19. The radio of claim 18, wherein said piezoelectric substrate is made of a material having a SAW coupling coefficient substantially exceeding 2 percent.

20. The radio of claim 19, wherein said piezoelectric substrate comprises lithium niobate.

21. The radio of claim 19, wherein said piezoelectric substrate comprises lithium tantalate.

22. The radio of claim 19, wherein said piezoelectric substrate comprises lead zirconate titanate.

23. The radio of claim 18, wherein said capacitive tuning means comprises a varactor.

* * * * *